(12) United States Patent
Yang et al.

(10) Patent No.: US 12,615,877 B2
(45) Date of Patent: Apr. 28, 2026

(54) SOLAR CELL AND PHOTOVOLTAIC MODULE

(71) Applicant: LONGI PHOTOVOLTAIC TECHNOLOGY (ORDOS) CO., LTD., Ordos (CN)

(72) Inventors: Yadi Yang, Ordos (CN); Miaomiao Ma, Ordos (CN); Dawei Li, Ordos (CN); Zanliang Zhao, Ordos (CN); Feilin Ping, Ordos (CN)

(73) Assignee: LONGI PHOTOVOLTAIC TECHNOLOGY (ORDOS) CO., LTD., Ordos (CN)

( * ) Notice: Subject to any disclaimer, the term of this patent is extended or adjusted under 35 U.S.C. 154(b) by 0 days.

(21) Appl. No.: 19/341,080

(22) Filed: Sep. 26, 2025

(65) Prior Publication Data

US 2026/0096247 A1 Apr. 2, 2026

(30) Foreign Application Priority Data

Sep. 27, 2024 (CN) .......................... 202411357965.6

(51) Int. Cl.
*H10F 77/70* (2025.01)
*H10F 77/40* (2025.01)

(52) U.S. Cl.
CPC ......... *H10F 77/703* (2025.01); *H10F 77/413* (2025.01)

(58) Field of Classification Search
CPC .............................. H10F 77/703; H10F 77/413
See application file for complete search history.

(56) References Cited

U.S. PATENT DOCUMENTS 11,791,426 B1 10/2023 Mao et al.
12,218,262 B2 * 2/2025 Yang ........................ H10F 19/80
(Continued)

FOREIGN PATENT DOCUMENTS

AU 2023251504 A1 11/2023
AU 2024204865 A1 8/2024
(Continued)

OTHER PUBLICATIONS

Office Action in Japanese Appln. No. 2025-159826, mailed on Oct. 23, 2025, 7 pages (with English translation).
(Continued)

*Primary Examiner* — Jayne L Mershon
(74) *Attorney, Agent, or Firm* — Fish & Richardson P.C.

(57) ABSTRACT

The present application relates to a solar cell and a photovoltaic module. In one aspect, a solar cell includes a silicon substrate and a passivation layer. The silicon substrate includes a first surface and an opposite second surface, and a plurality of side surfaces connecting the first surface and the second surface. At least one of the side surfaces includes a plurality of first texture regions and second texture regions. The first texture region includes a plurality of first pyramid structures. The second texture region includes a plurality of second pyramid structures. A structural dimension of the second pyramid structure is greater than a structural dimension of the first pyramid structure. The second texture regions are formed between adjacent first texture regions. The passivation layer covers the first texture regions and the second texture regions of at least one of the side surfaces.

14 Claims, 5 Drawing Sheets

(56)                    References Cited

U.S. PATENT DOCUMENTS

| | | | |
|---|---|---|---|
| 12,342,657 B1 * | 6/2025 | Wang | H10F 10/146 |
| 2013/0153025 A1 * | 6/2013 | Hahn | H10F 71/00 |
| | | | 438/71 |
| 2019/0157497 A1 | 5/2019 | Yoon et al. | |
| 2022/0209031 A1 | 6/2022 | Breus et al. | |
| 2024/0030364 A1 | 1/2024 | Ahn et al. | |
| 2024/0063324 A1 * | 2/2024 | Liu | H10F 71/129 |
| 2025/0318319 A1 * | 10/2025 | Liao | H10F 71/136 |
| 2026/0013266 A1 * | 1/2026 | Zhang | H10F 77/50 |

FOREIGN PATENT DOCUMENTS

| | | | |
|---|---|---|---|
| CN | 113078232 A | 7/2021 | |
| CN | 116613224 A | 8/2023 | |
| CN | 118016739 A | 5/2024 | |
| CN | 118335817 A | 7/2024 | |
| CN | 118380514 A | 7/2024 | |
| CN | 118412390 A | 7/2024 | |
| CN | 118472080 A | 8/2024 | |
| EP | 4401150 A2 | 7/2024 | |
| JP | 2006-286820 A | 10/2006 | |
| JP | 2014-072292 A | 4/2014 | |
| JP | 2024-010044 A | 1/2024 | |

OTHER PUBLICATIONS

Extended European Search Report in European Appln. No. 25204929.
1, mailed on Feb. 3, 2026, 10 pages.
Office Action in Australian Appln. No. 2025238104, mailed on Nov.
19, 2025, 4 pages.
Search Report in Chinese Appln. No. 202411357965.6, dated Dec.
6, 2024, 7 pages (with machine translation).

* cited by examiner

100

(a)

(b)

SOLAR CELL AND PHOTOVOLTAIC MODULE

CROSS-REFERENCE TO RELATED APPLICATIONS

This application claims priority to Chinese Patent Application No. 202411357965.6, filed on Sep. 27, 2024, which is hereby incorporated by reference in its entirety.

TECHNICAL FIELD

The present application relates to the technical field of photovoltaics, and in particular, to a solar cell and a photovoltaic module.

BACKGROUND

Solar cells can convert light energy into electric energy, which has important significance for energy development and environment protection. Solar cells prepared from monocrystalline silicon have advantages of high conversion efficiency, technical maturity, and the like, and have already occupied a large portion of photovoltaic industry. To reduce production costs, conductive substrate thinning will be an inevitable trend. However, a thinner conductive substrate may cause light absorption rate reduction of a substrate, and photogenerated carrier quantity reduction. Under the conductive substrate thinning trend, how to further increase the light absorption of a solar cell is a problem needing to be resolved urgently. In the related art, a pyramid textured structure is arranged at a side surface of a solar cell to improve the light trapping effect of the side surface and increase the light absorption of the solar cell. However, such a structure may affect the deposited film quality of a passivation layer at the side surface of the solar cell, reduce the passivation performance of the solar cell, and further affect the efficiency of the solar cell.

SUMMARY

An objective of the present application is to provide a solar cell and a photovoltaic module. By controlling the morphology of a side surface of the solar cell, the light trapping effect and the passivation performance of the side surface are balanced, so that the photoelectric conversion efficiency of the solar cell is improved.

To achieve the above objective, in a first aspect, the present application provides a solar cell. The solar cell includes a silicon substrate and a passivation layer. The silicon substrate includes a first surface and an opposite second surface, and a plurality of side surfaces connecting the first surface and the second surface. At least one of the side surfaces includes a plurality of first texture regions and second texture regions. The first texture region includes a plurality of first pyramid structures. The second texture region includes a plurality of second pyramid structures. A structural dimension of the second pyramid structure is greater than a structural dimension of the first pyramid structure. The second texture regions are formed between adjacent first texture regions. The passivation layer covers the first texture regions and the second texture regions of at least one of the side surfaces.

In some embodiments, the second texture regions extend among the first texture regions in one or more manners of a straight line, a broken line or a curve line.

In some embodiments, extending directions of the second texture regions are not parallel to a thickness direction of the solar cell, and the extending directions of at least two second texture regions are parallel to each other.

In some embodiments, the second texture regions include prismatic structures, and a length of the prismatic structures ranges from 200 nm to 6 μm.

In some embodiments, the structural dimension of the first pyramid structure ranges from 0.05 μm to 2 μm.

In some embodiments, the structural dimension of the second pyramid structure ranges from 2 μm to 6 μm.

In some embodiments, the at least one side surface includes a first region. The first region is connected with the first surface. The first texture regions and the second texture regions are arranged in the first region. A width of the first region accounts for 20% to 100% of a width of the side surface.

In some embodiments, the at least one side surface includes a first region and a second region. The first texture regions and the second texture regions are arranged in the first region. The second region is connected with one side of the second surface. The second region includes a plurality of pyramid-base texture structure.

In some embodiments, a boundary line between the first region and the second region is a curve line. A position of the second region close to the boundary line is provided with concave pits.

In some embodiments, in a thickness direction of the silicon substrate, a width of a region provided with the concave pits accounts for 0 to 60% of a width of the second region.

In some embodiments, a shape of the concave pits includes one or more of an inverted pyramid shape, an inverted hemispherical shape, and a terrace shape, and wherein a cross section area of a concave pit increases in a direction perpendicular to and away from the side surface.

In some embodiments, a diameter of a cross section of the concave pits on the side surface ranges from 0.1 μm to 5 μm, and a depth of the concave pits ranges from 0.05 μm to 2 μm.

In some embodiments, in a direction away from the silicon substrate, the passivation layer includes an aluminum oxide layer and a silicon nitride layer arranged in sequence.

In the above solar cell, the first pyramid structures of the first texture regions can enhance the light trapping effect of the side surface of the solar cell and improve the light utilization rate of the solar cell. Although the first pyramid structures in small structural dimensions enhance a surface roughness of the side surface and are unfavorable for a subsequent deposited film quality of the passivation layer at the side surface of the solar cell, the second pyramid structures in the second texture regions are also designed and formed according to embodiments of the present application. The second pyramid structures having the larger structural dimension can provide a larger surface area than the first pyramid structures, a larger deposited film area is provided for subsequent deposited films, and the deposited film quality is improved. Therefore, a hybrid structure of a plurality of first pyramid structures and a plurality of second pyramid structures can achieve effects of passivation and light trapping of the side surfaces of the solar cell at the same time, and improve the photoelectric conversion efficiency of the solar cell.

In a second aspect of the present application, a photovoltaic module is provided. The photovoltaic module includes a plurality of solar cells electrically connected with each other, and the solar cells are solar cells provided by the first aspect of the present application.

DESCRIPTIONS OF SYMBOLS OF MAIN ELEMENTS

Figure 1:
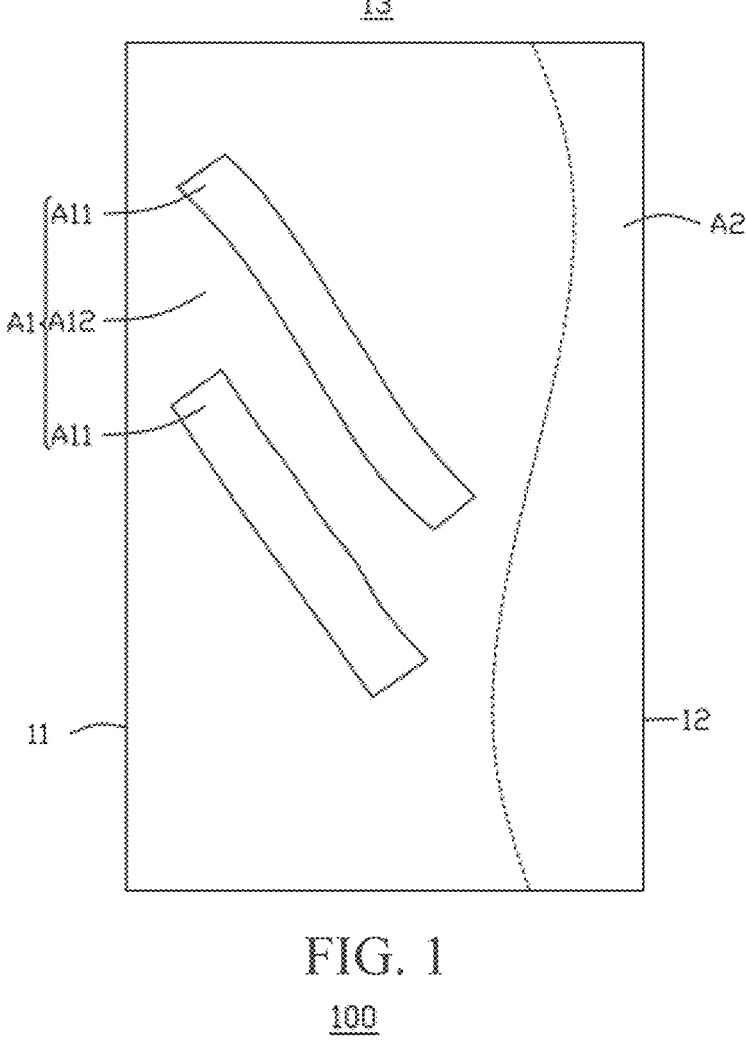
FIG. 1 is a schematic diagram of distribution of texture structures at a side surface of a solar cell according to an embodiment of the present application.

100—solar cell, 10—silicon substrate, 11—first surface, 12—second surface, 13—side surface, 131—first side surface, 132—second side surface, 133—third side surface, 134—fourth side surface, 20—first dielectric layer, 30—first doped conductive layer, 40—second dielectric layer, 50—second doped conductive layer, A1—first region, A11—first texture region, A12—second texture region, A2—second region, T11—pyramid structure, T12—prismatic structure, T13—pyramid-base texture structure, T21—third pyramid structure, R—concave pit, and D1—thickness direction of silicon substrate.

DETAILED DESCRIPTION

To make the technical problems to be resolved, the technical solutions, and the beneficial effects of the present application clearer and more comprehensible, the present application is further illustrated in detail with reference to the accompanying drawings and embodiments. It should be understood that the specific embodiments described herein are provided for describing the present application only and not intended to limit the present application.

Embodiments of the present application are described below in detail, examples of the embodiments are shown in the accompanying drawings, and the same or similar symbols indicate same or similar elements or elements with the same or similar functions throughout the specification. The following embodiments described with reference to the accompanying drawings are exemplary embodiments, and are merely intended to describe the embodiments of the present application but cannot be construed as a limitation to the present application.

In the description of the embodiments of the present application, terms "center", "longitudinal", "transverse", "length", "width", "thickness", "upper", "lower", "front", "rear", "left", "right", "vertical", "horizontal", "top", "bottom", "inner", "outer", "clockwise", "counterclockwise", and the like indicating the orientation or the positional relationship are based on the orientation or the positional relationship shown in the accompanying drawings, are only for convenience of describing the implementations of the present application and simplifying the descriptions, are not intended to indicate or imply that the referenced apparatus or element needs to have a particular orientation, be constructed and operated in a particular orientation, and therefore cannot be understood as a limitation of the present application.

In the description of the embodiments of the present application, the terms "first" and "second" are merely intended for a purpose of description and shall not be understood as indicating or implying relative significance or implicitly indicating the number of indicated technical features. Therefore, features defined with "first" and "second" may explicitly or implicitly include one or more such features.

In the description of the embodiments of the present application, unless otherwise specified, "a plurality of" means two or more.

In the description of the embodiments of the present application, unless otherwise specified, terms "install", "connection" and "connect" should be understood in a broad sense. For example, the connection may be a fixed connection, a detachable connection, or an integral connection; or the connection may be a mechanical connection, an electrical connection, or mutual communication; or the connection may be a direct connection, an indirect connection through an intermediate medium, internal communication between two elements, or an interaction relationship between two elements.

For those of ordinary skill in the art, the specific meaning of the above terms in the present application can be understood according to specific circumstances.

Figure 2:
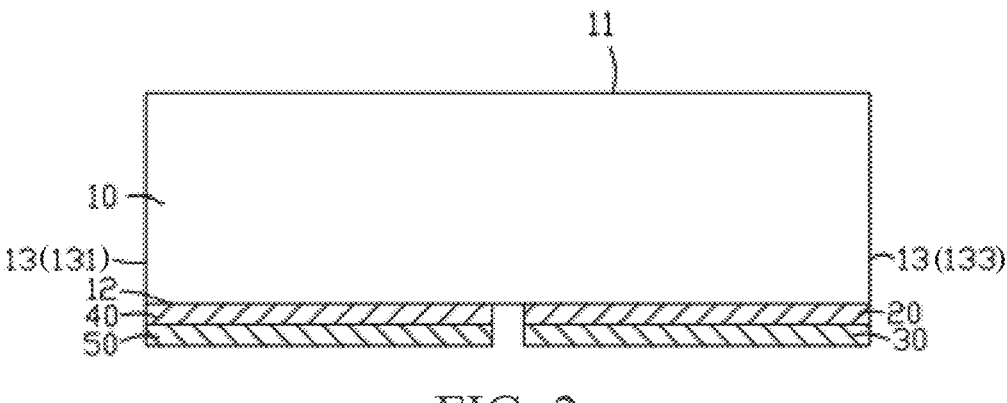
FIG. 2 is a schematic structural diagram of a solar cell according to an embodiment of the present application.

Referring to FIG. 1 and FIG. 2, a solar cell 100 includes a silicon substrate 10. The silicon substrate 10 can be an N-type silicon substrate or a P-type silicon substrate.

Specifically, the silicon substrate 10 includes a first surface 11 and an opposite second surface 12, and a plurality of side surfaces 13 connecting the first surface 11 and the second surface 12.

A type of the solar cell 100 is not limited to that shown in FIG. 2. Specifically, the type of the solar cell 100 is a tunnel oxide passivated contact back contact (TBC) solar cell, a tunnel oxide passivated contact (TOPCon) solar cell, or a hybrid back contact solar cell. The hybrid back contact solar cell refers to a back contact solar cell with an N region and a P region respectively corresponding to a tunnel passivated contact structure and a heterojunction contact structure, or a back contact solar cell with an N region and a P region respectively corresponding to a tunnel passivated contact structure and a passivated emitter structure. The silicon substrate of the solar cell 100 is an N-type conductive substrate or a P-type conductive substrate.

Figure 3:
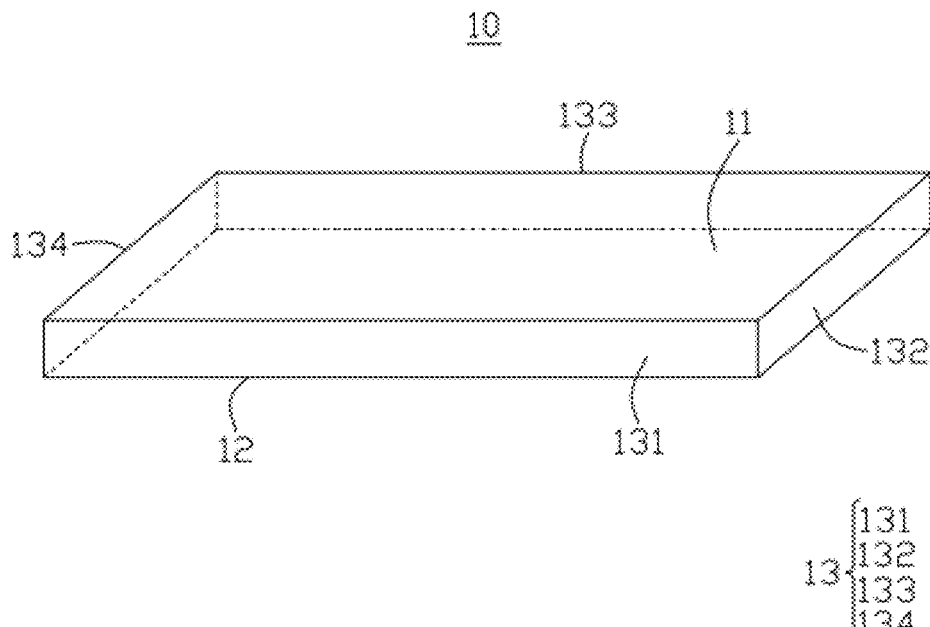
FIG. 3 is a schematic structural diagram of a silicon substrate of the solar cell in FIG. 2.

A structure of the silicon substrate 10 is described in detail below. FIG. 3 is a schematic structural diagram of the silicon substrate 10 of the solar cell 100 in FIG. 2. As shown in FIG. 3, the silicon substrate 10 is approximately in a shape of a cuboid. The side surfaces 13 include a first side surface 131, a second side surface 132, a third side surface 133, and a fourth side surface 134 that are connected in sequence. The first side surface 131 and the third side surface 133 are in opposite arrangement. The second side surface 132 and the fourth side surface 134 are in opposite arrangement.

Figure 4:
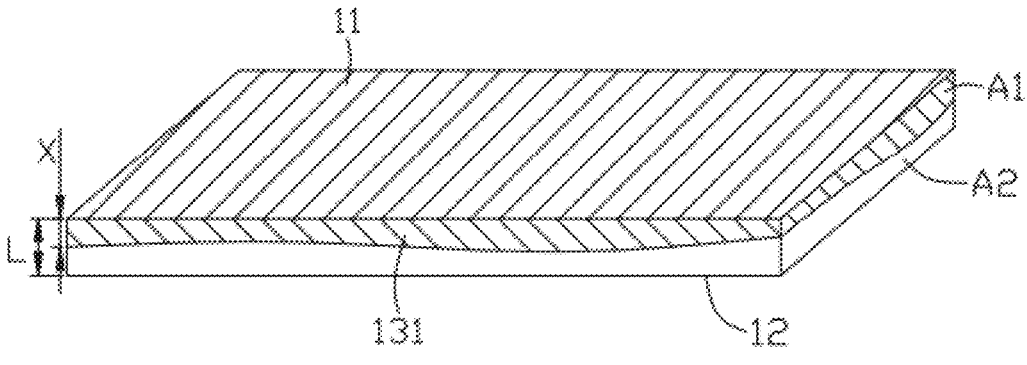
FIG. 4 is a schematic diagram of distribution of texture structures of a silicon substrate of the solar cell in FIG. 2.
Figure 5:
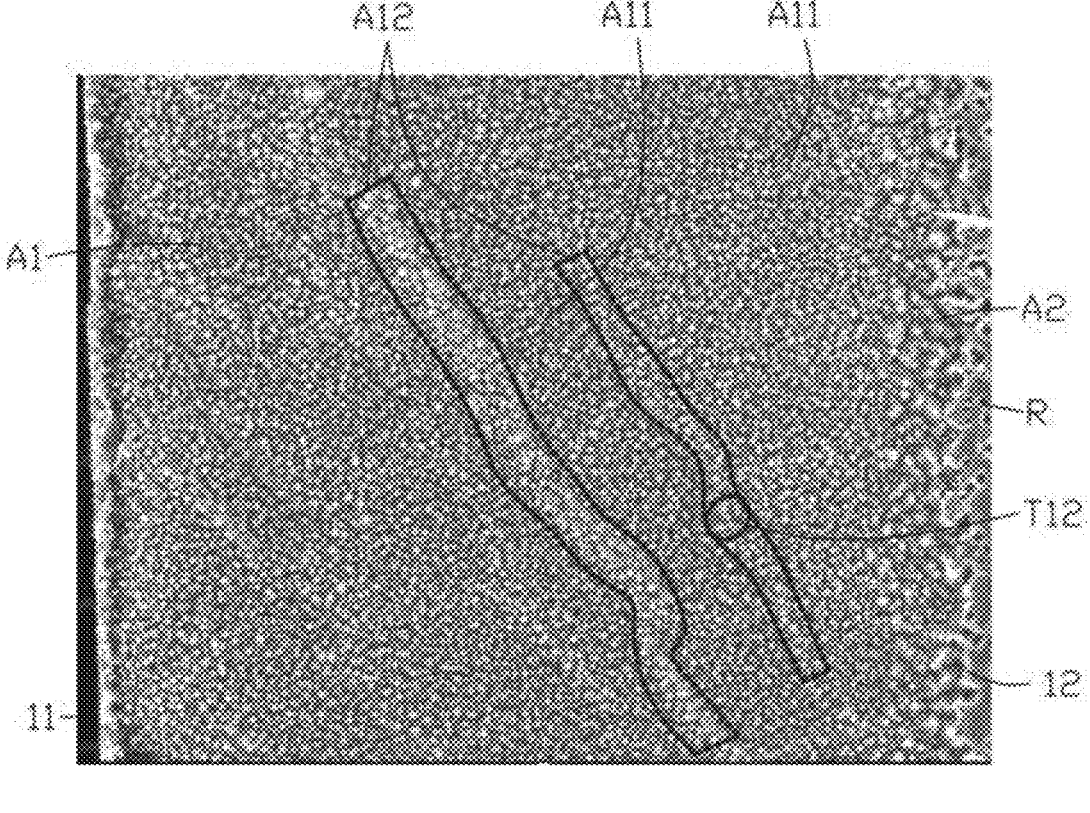
FIG. 5 is a scanning electron microscope diagram of a side surface of a solar cell according to an embodiment of the present application.

FIG. 4 is a schematic diagram of distribution of texture structures of the silicon substrate 10 of the solar cell 100 in FIG. 2. FIG. 5 is a scanning electron microscope diagram of the side surface 13 of the solar cell 100 according to an embodiment of the present application.

Referring to FIG. 1 to FIG. 5 together, at least one side surface 13 of the silicon substrate 10 is provided with a plurality of pyramid structures T11. Specifically, the plurality of pyramid structures T11 include a plurality of first pyramid structures and a plurality of second pyramid structures. More specifically, through the distribution of the plurality of pyramid structures T11, at least one side surface 13 of the silicon substrate 10 includes a plurality of first texture regions A11 and second texture regions A12. The first texture region A11 includes a plurality of first pyramid structures. The second texture region A12 includes second pyramid structures. A structural dimension of the second pyramid structure is greater than a structural dimension of the first pyramid structure. The second texture regions A12 are formed between adjacent first texture regions A11. The solar cell 100 includes a passivation layer (not shown in the figures), and the passivation layer covers the first texture regions A11 and the second texture regions A12 of at least one of the side surfaces 13.

It needs to be noted that in the embodiments of the present application, the structural dimension of the first pyramid structure refers to any one of a length, a width, or a diagonal line length of a bottom surface of the first pyramid structure, and/or a pyramid height of the first pyramid structure. The structural dimension of the second pyramid structure refers to any one of a length, a width, or a diagonal line length of a bottom surface of the second pyramid structure, and/or a pyramid height of the second pyramid structure.

In the related art, a pyramid-base texture structure is formed at the side surface of the silicon substrate of the solar cell. Although the pyramid-base texture structure can improve the deposited film quality of the passivation layer at the side surface, it can increase the reflective rate of the side surface on light, so that the light absorption performance of the solar cell can be reduced. Alternatively, a pyramid textured structure with a single dimension range is formed at the side surface of the silicon substrate of the solar cell. The textured structure can enhance the light trapping effect of the side surface of the silicon substrate of the solar cell, but can increase the roughness of the side surface of the silicon substrate, so it is unfavorable for improving the passivation performance of the side surface of the silicon substrate.

In the embodiments of the present application, the side surface 13 of the solar cell 100 includes a plurality of pyramid structures T11. The first pyramid structures of the first texture region A11 can enhance the light trapping effect of the side surface of the solar cell 100 and improve the light utilization rate of the solar cell 100. In addition, the second pyramid structures in the second texture regions A12 are also designed and formed according to the embodiments of the present application. The second pyramid structures having the larger structural dimension can provide a larger surface area than the first pyramid structures, a larger deposited film area is provided for subsequent passivation layer deposited films, and the deposited film quality of the passivation layer is improved, and the passivation performance of the side surface 13 is improved. Therefore, compared with the pyramid-base textured structure or the pyramid structures having the single structural dimension in the related art, a hybrid structure of a plurality of first pyramid structures and a plurality of second pyramid structures can achieve effects of passivation and light trapping of the side surfaces of the solar cell at the same time, and improve the photoelectric conversion efficiency of the solar cell.

In some embodiments, the passivation layer further covers positions of the side surface 13 except for the first texture regions A11 and the second texture regions A12.

In some embodiments, referring to FIG. 2, the solar cell 100 further includes a first dielectric layer 20, a first doped conductive layer 30, a second dielectric layer 40, and a second doped conductive layer 50.

The first dielectric layer 20 and the second dielectric layer 40 are alternately arranged in the second surface 12. The first doped conductive layer 30 is positioned at one side of the first dielectric layer 20 away from the silicon substrate 10. The second doped conductive layer 50 is positioned at one side of the second dielectric layer 40 away from the silicon substrate 10.

Conduction types of the first doped conductive layer 30 and the second doped conductive layer 50 are opposite. The conduction type of the first doped conductive layer 30 is N type, and the conduction type of the second doped conductive layer 50 is P type; or the conduction type of the first doped conductive layer 30 is P type, and the conduction type of the second doped conductive layer 50 is N type.

An isolation region is formed between the first dielectric layer 20 and the second dielectric layer 40, and between the first doped conductive layer 30 and the second doped conductive layer 50, so as to form electrical isolation between the first doped conductive layer 30 and the second doped conductive layer 50. It needs to be noted that under practical conditions, the isolation region can be formed for electrical isolation, and other modes can also be adopted without the formation of the isolation region as long as electrical isolation is formed between film layers or regions of different doped types.

Materials of the first dielectric layer 20 and the second dielectric layer 40 can be but are not limited to materials such as silicon oxide, aluminum oxide, titanium oxide, or intrinsic amorphous silicon. Materials of the first doped conductive layer 30 and the second doped conductive layer 50 can be but are not limited to materials such as doped polysilicon or doped amorphous silicon.

Besides covering at least one of the side surfaces 13, the passivation layer further covers the first surface 11 and/or the second surface 12. Specifically, the passivation layer covers at least one side surface 13 and the first surface 11 of the solar cell 100, or the passivation layer covers at least one side surface 13 and the second surface 12 of the solar cell 100, or the passivation layer covers at least one side surface 13, the first surface 11 and the second surface 12 of the solar cell 100. When the passivation layer covers the second surface 12, the passivation layer covers one side of the first doped conductive layer 30 away from the silicon substrate 10, and one side of the second doped conductive layer 50 away from the silicon substrate 10.

A material of the passivation layer can be but is not limited to one or more of materials such as aluminum oxide, silicon oxide, and silicon oxynitride, and the passivation layer is configured to passivate a surface of the silicon substrate 10 or a function layer and reduce or eliminate reflection light on a surface of the solar cell 100, so as to increase the utilization rate of the solar cell 100 on sun light and improve the photoelectric conversion efficiency.

In some embodiments, the passivation layer includes an aluminum oxide layer and a silicon nitride layer arranged in sequence. A thickness of the aluminum oxide layer ranges from 4 nm to 10 nm (for example, 4 nm to 6 nm, 6 nm to 8 nm, 8 nm to 10 nm, and the like). The silicon nitride layer can be a single-layer structure or a laminated structure of different refractive indexes, and a thickness of the silicon nitride layer ranges from 50 nm to 150 nm (for example, 50 nm to 60 nm, 60 nm to 70 nm, 70 nm to 80 nm, 80 nm to 90 nm, 90 nm to 100 nm, and the like).

The passivation layer can reduce recombination centers on the surface of the silicon substrate or a surface of other film layers by means of field passivation or chemical passivation and reduce a recombination phenomenon of carriers on the surface of the solar cell, so as to improve the efficiency of the solar cell. In addition, the outermost passivation layer can reduce reflection of sun light, and enhance the light absorption capability of the solar cell. For example, the aluminum oxide layer is saturated with dangling bonds on the surface of the side surface 13, an interfacial state density is reduced, and the side surface is passivated. The silicon nitride layer can realize protection on the aluminum oxide layer, and realize internal reflection, so that the light utilization rate of the solar cell is improved.

In some embodiments, the thickness of the silicon nitride layer positioned at the side surface 13 is greater than the thickness of the silicon nitride layer positioned on the first surface 11 or the second surface 12. In comparison, an area of the side surface 13 is much smaller than that of the first surface 11 or the second surface 12, so the deposited film quality of the passivation layer is not as good as that of the first surface 11 or the second surface 12. Therefore, the thicker silicon nitride layer can ensure the deposited film continuity of the silicon nitride layer covering the side surface to the maximum degree, so as to realize the protection and passivation effects on the aluminum oxide layer and the side surface 13, as well as the reflection of light.

In some embodiments, the second texture regions A12 extend between the first texture regions A11 in any one or more manners of a straight line, a broken line and/or a curve line. Further, extending directions of the second texture regions A12 are not parallel to a thickness direction of the solar cell 100, and the extending directions of at least two second texture regions A12 are parallel.

Therefore, it is favorable for enhancing the morphology change regularity of the side surface of the solar cell 100, so that the uniformity of a film layer formed at the side surface of the solar cell 100 can be further improved, and the passivation effect on the side surface of the solar cell 100 is improved.

Specifically, the side surface 13 is provided with a first region A1 connected with the first surface 11. The first texture regions A11 and the second texture regions A12 are arranged on the first region A1. A structural dimension of the first pyramid structures in the pyramid structures T11 ranges from 0.05 μm to 2 μm. A structural dimension of the second pyramid structures in the pyramid structures T11 ranges from 2 μm to 6 μm.

Exemplarily, a bottom surface dimension of the first pyramid structures and/or a pyramid height dimension of the first pyramid structures in the pyramid structures T11 range/ranges from 0.05 μm to 2 μm (for example, 0.05 μm to 0.1 μm, 0.1 μm to 0.5 μm, 0.5 μm to 1.1 μm, 1.1 μm to 1.3 μm, 1.3 μm to 1.5 μm, 1.5 μm to 1.8 μm, 1.8 μm to 2 μm, and the like). A bottom surface dimension of the second pyramid structures and/or a pyramid height dimension of the second pyramid structures in the pyramid structures T11 range/ranges from 2 μm to 6 μm (for example, 2 μm to 2.3 μm, 2.3 am to 2.8 μm, 2.8 μm to 3.3 μm, 3.3 μm to 4 μm, 4 μm to 5 μm, 5 μm to 6 μm, and the like).

Detailed descriptions on the embodiments of the present application are provided below with reference to FIG. 5.

As shown in FIG. 5, the second texture regions A12 extend between the first texture regions A11 in a broken line manner. Further, the extending directions of the second texture regions A12 are not parallel to the thickness direction of the solar cell 100.

It needs to be noted that two second texture regions A12 are shown by solid boxes in FIG. 5, and FIG. 5 only shows some of the second texture regions A12. In practical application, the quantity of the second texture regions A12 in the side surface 13 includes but is not limited to that of the second texture regions A12 shown by black boxes, and in addition, the sizes and the extending directions of the second texture regions A12 are not limited to those of the manners of the second texture regions A12 shown by the solid boxes.

Angles between the extending directions of the second texture regions A12 and the thickness direction D1 of the solar cell 100 have the same calculation rule, and refer to angles between the extending directions of the second texture regions A12 and the thickness direction D1 of the solar cell 100 in an anticlockwise direction (or a clockwise direction).

In some embodiments, orthographic projections of the second pyramid structures on the side surface 13 are overlapped.

In addition, the second texture regions A12 further include a plurality of prismatic structures T12 (as shown by a dotted oval region in FIG. 5). Compared with the textured structure in a pyramid shape, the prismatic structures T12 can provide a flatter and smoother surface than the first pyramid structures, the prismatic structures T12 have larger surface areas, and a larger deposition area is provided for subsequent deposition of the passivation layer. Therefore, the prismatic structures T12 are favorable for further improvement of the subsequent deposited film quality. Therefore, compared with the single textured structure or the pyramid-base texture structure in the related art, a hybrid structure of a plurality of first pyramid structures, a plurality of second pyramid structures, and a plurality of prismatic structures T12 can achieve effects of passivation and light trapping of the side surfaces 13 of the solar cell 100 at the same time.

In some embodiments, a length of the prismatic structures T12 ranges from 200 nm to 6 μm (for example, 200 nm to 500 nm, 500 nm to 1 μm, 1 μm to 3 μm, 3 μm to 5 μm, 5 μm to 6 μm, and the like).

It needs to be noted that the length of the prismatic structure T12 refers to a distance of the prismatic structure T12 from the lowest end to a top end in an inclination direction of the prismatic structure T12.

In some embodiments, some of the prismatic structures T12 include a bottom portion in a prism shape and a top portion connected with the bottom portion and being approximately in a pyramid shape. Some of the prismatic structures T12 are approximately in a prism shape as a whole.

The side surface 13 further includes a second region A2. The second region A2 is connected with one side of the first region A1 close to the second surface 12.

Figure 6:
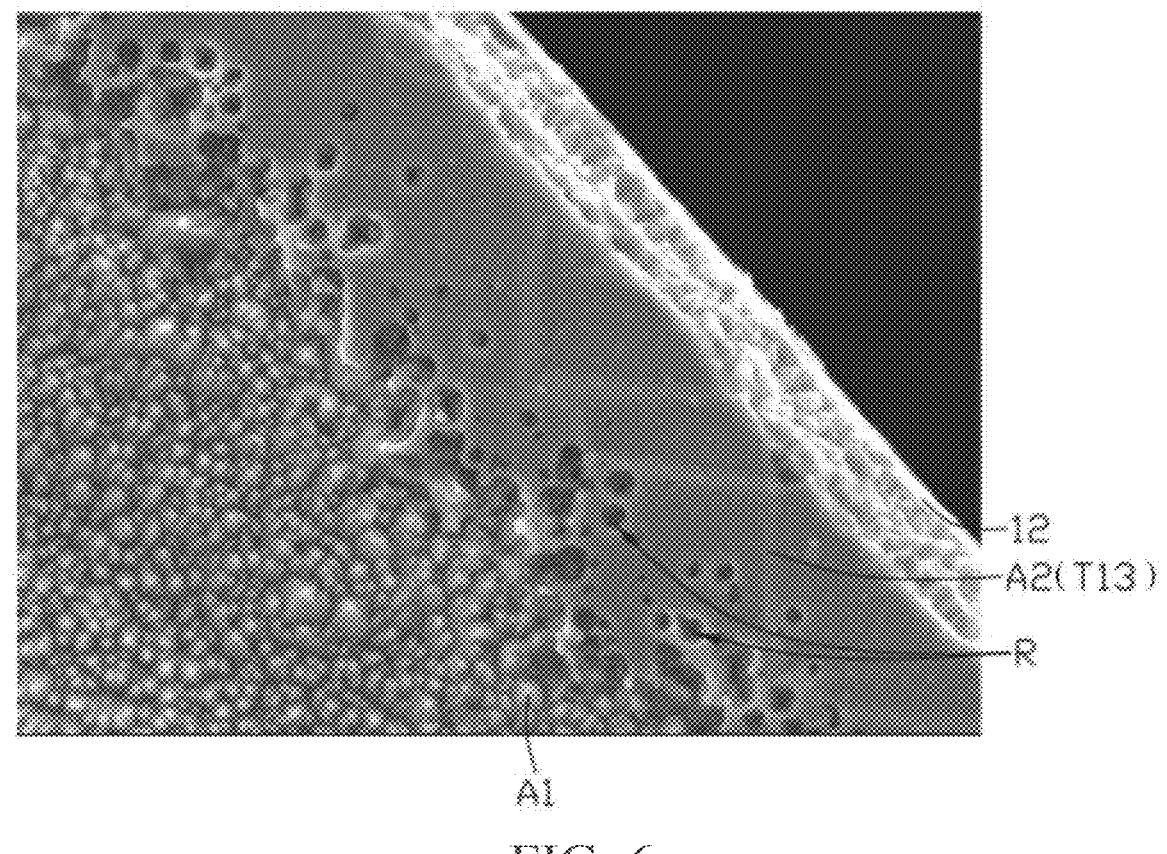
FIG. 6 is another scanning electron microscope diagram of a side surface of a solar cell according to an embodiment of the present application.

FIG. 6 is another scanning electron microscope diagram of the side surface 13 of the solar cell 100 according to an embodiment of the present application. As shown in FIG. 6, the second region A2 includes a plurality of pyramid-base texture structures T13.

The second region A2 having a plurality of pyramid-base texture structures T13 is favorable for increasing a specific surface area of the side surfaces of the solar cell 100 to improve a specific surface area of subsequent plated film layers, so that the passivation effect of the passivation layer on the side surfaces of the solar cell 100 is improved. In addition, the passivation performance of the pyramid-base texture structures T13 of the second region A2 after the passivation layer film deposition is better. Since the portion close to the second surface 12 has the better passivation performance, a recombination probability of carriers on edges of the solar cell 100 can be reduced, and the performance of the solar cell 100 can be favorably improved.

The problem of excessive etching on the second surface 12 can be improved by combining the process. In the solar cell 100 according to the embodiment of the present application, by forming the second region A2 in the side surface, the passivation performance of the solar cell 100 can be improved, and at the same time, excessive etching of an etching solution on the function layer of the second surface can be reduced.

In some embodiments, a shape of the pyramid-base texture structures T13 includes one of a square shape or an approximately square shape.

For example, a transverse dimension of the pyramid-base texture structures T13 ranges from 10 μm to 30 μm (for example, 10 μm to 12 μm, 12 μm to 13 μm, 13 μm to 14.5 μm, 14.5 μm to 15 μm, 15 μm to 20 μm, 20 μm to 25 μm, 25 μm to 28 μm, 28 μm to 30 μm, and the like). Specifically, the transverse dimension of the pyramid-base texture structures T13 refers to a longest distance of pyramid base bottom surfaces of the pyramid-base texture structures T13.

Exemplarily, a pyramid base longitudinal height of the pyramid-base texture structures T13 ranges from 0.01 μm to 8 μm (for example, 0.01 μm to 0.05 μm, 0.05 μm to 0.1 μm, 0.1 μm to 0.4 μm, 0.4 μm to 0.5 μm, 0.5 μm to 0.7 μm, 0.7 μm to 1 μm, 1 μm to 1.3 μm, 1.3 μm to 1.5 μm, 1.5 μm to 1.8 μm, 1.8 μm to 2.3 μm, 2.3 μm to 2.8 μm, 2.8 μm to 3.3 μm, 3.3 μm to 4 μm, 4 μm to 5 μm, 5 μm to 6 μm, 6 μm to 7 μm, 7 μm to 8 μm, and the like).

In some embodiments, there is a condition that the pyramid-base texture structures T13 are not completely displayed in the second region A2.

In some embodiments, a boundary line between the first region A1 and the second region A2 is a curve line. A position of the second region A2 close to the boundary line is provided with concave pits R, and in a thickness direction of the silicon substrate 10, a width of a region provided with the concave pits R accounts for 0 to 60% (for example, 0 to 10%, 10% to 20%, 20% to 30%, 30% to 40%, 40% to 50%, 50% to 60%, and the like) of a width of the second region A2.

In some embodiments, a shape of the concave pits R includes one or more of an inverted pyramid shape, an inverted hemispherical shape, and a terrace shape.

In some embodiments, in a direction perpendicular to but away from the side surface 13, a cross section area of the concave pits R is gradually increased.

In some embodiments, a diameter of a cross section of the concave pits R on the side surface 13 ranges from 0.1 μm to 5 μm (for example, 0.1 μm to 1 μm, 1 μm to 1.5 μm, 1.5 μm to 2 μm, 2 μm to 3.5 μm, 3.5 μm to 5 μm, and the like)

Specifically, the diameter of the cross section of the concave pits R on the side surface 13 is a diameter of a cross section with the longest distance from the bottom surfaces of the concave pits R, or a diameter of a cross section of openings of the concave pits R.

The diameter of the concave pits R is acquired through a three-dimensional microscope or a scanning electron microscope, and a depth of the concave pits R is acquired through being scanned by a three-dimensional microscope.

The concave pits R are formed in a junction of the first region A1 and the second region A2, so that the first region A1 and the second region A2 have a morphology transition change trend, the occurrence of obvious undulation on the side surface 13 is reduced, and the subsequent deposited film quality at the boundary line is favorably improved. In addition, the concave pits R positioned in the second region A2 can achieve an effect of partially improving the light trapping effect of incident light rays.

In some embodiments, the depth of the concave pits R ranges from 0.05 μm to 2 μm (for example, 0.05 μm to 0.1 μm, 0.1 μm to 0.5 μm, 0.5 μm to 1 μm, 1 μm to 1.5 μm, 1.5 μm to 2 μm, and the like).

In some embodiments, in an extending direction from the first surface 11 to the second surface 12, a distribution proportion of the first region A1 in the side surface 13 ranges from 20% to 100%. Specifically, in the extending direction from the first surface 11 to the second surface 12, the distribution proportion of the first region A1 in the side surface 13 refers to a percentage of a length of the first region A1 to a thickness of the solar cell 100 in the thickness direction of the solar cell 100. More specifically, the length of the first region A1 in the thickness direction of the solar cell 100 refers to a vertical distance from an intersection position of the first surface 11 and the side surface 13 to the lowest point of the boundary line of the first region A1 and the second region A2 in the thickness direction of the solar cell 100.

In some embodiments, in the extending direction from the first surface 11 to the second surface 12, the first region A1 has a width X (shown in FIG. 4). A ratio of the width X of the first region A1 to a thickness L (shown in FIG. 4) of the silicon substrate 10 ranges from 20% to 100% (for example, 20% to 35%, 35% to 40%, 40% to 55%, 55% to 70%, 70% to 80%, 80% to 85%, 85% to 90%, 90% to 95%, 95% to 100%, and the like).

Therefore, a minimum value of the proportion range of the first region A1 can ensure the distribution of the pyramid structures T11 in the side surface 13, and the light trapping effect of the side surface 13 can be increased. A maximum value of the proportion range can simultaneously ensure that the pyramid structures T11 achieve the light trapping effect and a sufficient area is provided for the extension of the second texture regions A12 between the first texture regions A11, so that the surface area of the side surface of the first texture regions is improved, and the deposited film quality of the passivation layer is improved.

In some embodiments, in combination with the process, the proportion of the first region A1 can ensure the provision of good surface basis for subsequent working procedures such as texturing and film deposition after the complete removal of a to-be-cleaned film layer of the first surface 11 in a chain etching process. In this case, through the proportion of the first region A1, the problem of excessive etching of a film layer on a back surface (the second surface 12) in the chain etching process can be improved.

In some embodiments, the proportion of the first region A1 in the side surface 13 reaches 80% to 100%. Therefore, the distribution of the plurality of pyramid structures T11 and the plurality of prismatic structures T12 account for most or even all of the side surface 13, the plurality of pyramid structures T11 and the plurality of prismatic structures T12 of the side surface 13 are favorable for improving the light trapping effect and the passivation performance of the solar cell 100, and balancing the relationship between the light trapping effect and the passivation performance of the solar cell at the same time, and finally, the solar cell efficiency of the solar cell 100 is improved.

In some embodiments, in an extending direction from the second surface 12 to the first surface 11, a distribution proportion of the second region A2 in the side surface 13 is greater than 0 but smaller than or equal to 80%. Specifically, in the extending direction from the second surface 12 to the first surface 11, a ratio of a width (L–X) of the second region A2 to the thickness L of the silicon substrate 10 is greater than 0 but smaller than or equal to 80% (for example, from 0 to 5%, 5% to 10%, 10% to 15%, 15% to 18%, 18% to 20%, 20% to 35%, 35% to 40%, 40% to 55%, 55% to 70%, 70% to 80%, and the like).

When the ratio of the width (L–X) of the second region A2 to the thickness L of the silicon substrate 10 is too small, the excessive etching risk of the function layer of the second surface 12 is increased; and when the ratio is too large, it is difficult to ensure the removal of the film layer on the edge of the first surface 11. Therefore, an interlayer tiny defect generation probability caused by different lateral etching efficiency of the function layer and the silicon substrate 10 can be reduced to reduce the recombination problem of the finally acquired solar cell and improve the passivation effect of the solar cell. Therefore, the solar cell efficiency of the solar cell is improved.

In some embodiments, the side surface 13 consists of a first region A1 and a second region A2. That is, in any one side surface 13, in the extending direction from the second surface 12 to the first surface 11, a sum of the distribution proportion of the first region A1 in the side surface 13 and the distribution proportion of the second region A2 in the side surface 13 is 100%.

In some embodiments, the second region A2 is at least formed on one of the first side surface 131, the second side surface 132, the third side surface 133, and the fourth side surface 134. That is, the second region A2 (or a coexistence structure of a polished surface and the pyramid-base texture structures T13) can be formed on any one, any two, any three, or four of the first side surface 131, the second side surface 132, the third side surface 133, and the fourth side surface 134.

In some embodiments, the first side surface 131, the second side surface 132, the third side surface 133, and the fourth side surface 134 are not provided with the second region A2.

Figure 7:
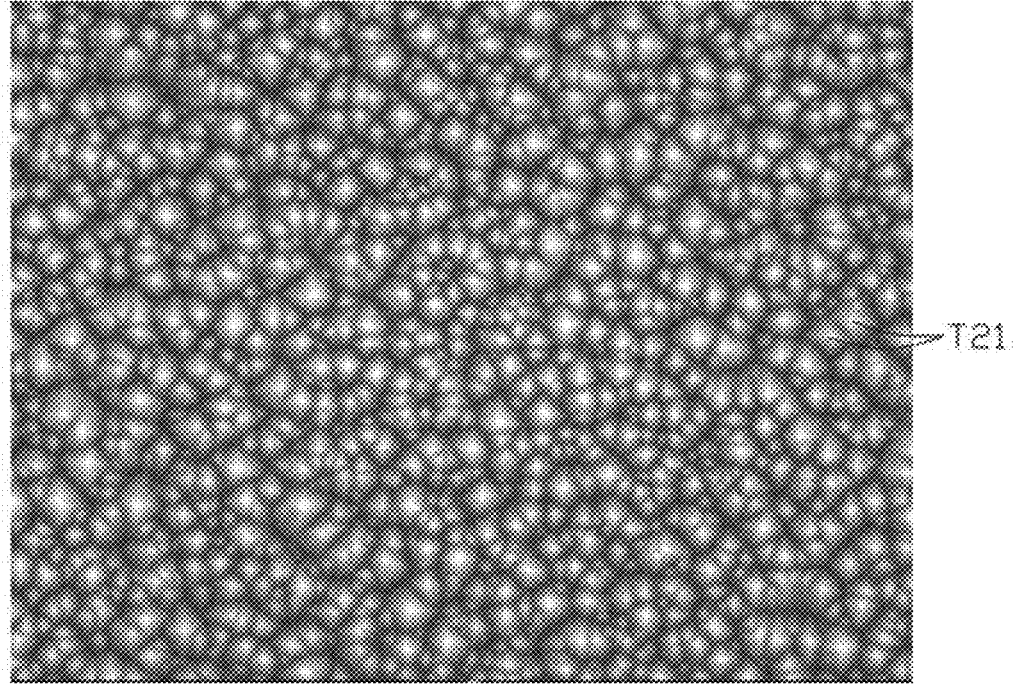
FIG. 7 is a scanning electron microscope diagram of a first surface of a solar cell according to an embodiment of the present application.

FIG. 7 is a scanning electron microscope diagram of the first surface 11 of the solar cell 100 according to an embodiment of the present application. As shown in FIG. 7, the first surface 11 is provided with a plurality of third pyramid structures T21 to enhance the light trapping effect of the side where the first surface 11 of the solar cell 100 is located.

It needs to be noted that the third pyramid structures T21 on the first surface 11 and the pyramid structures T11 on the side surface 13 do not have completely identical sizes, but have different sizes.

Exemplarily, a bottom surface dimension of the third pyramid structures T21 ranges from 0.05 μm to 2 μm (for example, 0.05 μm to 0.1 μm, 0.1 μm to 0.5 μm, 0.5 μm to 1.1 μm, 1.1 μm to 1.3 μm, 1.3 μm to 1.5 μm, 1.5 μm to 1.8 μm, 1.8 μm to 2 μm, and the like).

Exemplarily, a pyramid height of the third pyramid structures T21 ranges from 0.1 μm to 2 μm (for example, 0.1 μm to 0.5 μm, 0.5 μm to 1 μm, 1 μm to 1.3 μm, 1.3 μm to 1.5 μm, 1.5 μm to 1.8 μm, 1.8 μm to 2 μm, and the like). When the bottom surface transverse dimension and the longitudinal height of the third pyramid structures T21 are improper, the secondary reflection of the third pyramid structures T21 on the light is insufficient, so the textured surface reflectivity is increased, and the light absorption performance of the solar cell is worsened.

Specifically, a shape of orthographic projections of the bottom surfaces of the pyramid structures T11 on the side surface 13 and a shape of orthographic projections of the third pyramid structures T21 on the first surface 11 can be regular quadrangle shapes, or can be irregular polygon shapes. When the shapes are regular polygon shapes, referring to FIG. 8 (a), a structural dimension of bottom edges of the pyramid structures T11 and the third pyramid structures T21 is: a length d1 of the longest diagonal line of the bottom edges of the pyramid structure, or the longest edge length d2. When the shapes are irregular quadrangle shapes, the diagonal line length and the edge length of the bottom edges of the pyramid structures T11 and the third pyramid structures T21 are not absolute, and are artificially defined to represent the size of the bottom surfaces. For example, the edge length of the bottom edges of the pyramid structures T11 and the third pyramid structures T21 can be defined as the edge length of the longest edge of the irregular quadrangle, and the diagonal line length of the bottom edges of the pyramid structures T11 and the third pyramid structures T21 can be defined as the length of the longest diagonal line of the irregular quadrangle. The pyramid height of the pyramid structures T11 and the third pyramid structures T21 is a height of the pyramid structure from a pyramid spire to the bottom surface. It could be understood that the above is only an exemplary description, and it can be flexibly defined according to practical requirements in practical application.

It needs to be noted that the pyramid structures T11 and the third pyramid structures T21 are in staggered size distribution, the above dimensions are the structural dimension of the pyramid structures T11 and/or the structural dimensions of the third pyramid structures T21 relatively uniformly distributed in an observation interface when the textured surfaces on the first surface 11 or the side surface 13 are amplified. In addition, as a schematic diagram of a test method, FIG. 8 (a) has no direct correlation with the practical bottom surface morphology of the pyramid structures T11 and the practical bottom surface morphology of the third pyramid structures T21.

Figure 8:
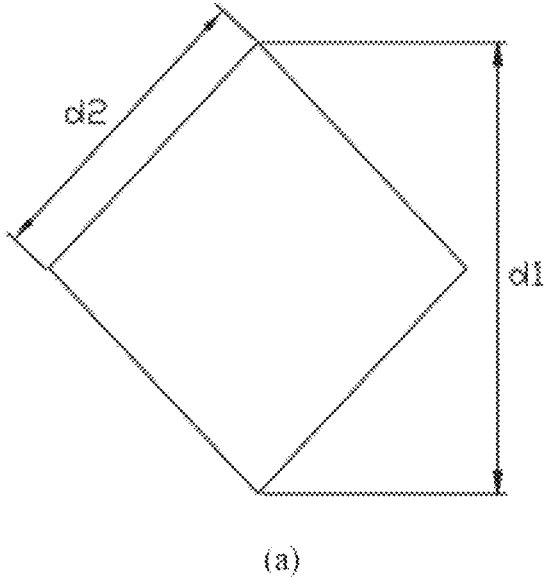
FIG. 8 is a schematic diagram of a structural dimension of a pyramid structure and a structural dimension of a pyramid-base texture structure in a solar cell according to an embodiment of the present application.
Figure 8:
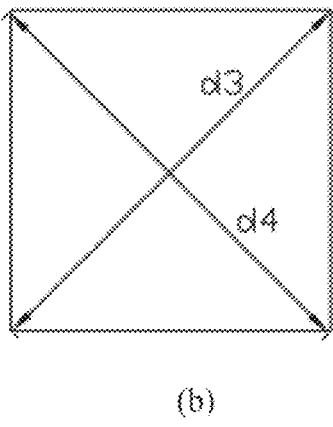

Specifically, as shown in FIG. 8 (b), a method for measuring a pyramid base bottom surface dimension of the pyramid-base texture structure T13 is as follows: in a direction parallel to the bottom surface of the pyramid-base texture structure T13, a larger value of a pyramid base diagonal line length d3 and a pyramid base diagonal line length d4 is taken. A method for measuring a pyramid base longitudinal height of the pyramid-base texture structure T13 is as follows: a height difference between the bottom surface of the pyramid-base texture structure T13 and a plane of the side surface 13 is taken.

It needs to be noted that the pyramid-base texture structures T13 are in staggered size distribution, the above dimensions are the pyramid base dimensions of the pyramid-base texture structures T13 relatively uniformly distributed in an observation interface when the textured surfaces on the side surface 13 are amplified. In addition, as a schematic diagram of a test method, FIG. 8 (b) has no direct correlation with the practical pyramid-base texture morphology of the pyramid-base texture structures T13.

Embodiments of the present application further provide a photovoltaic module. The photovoltaic module includes a plurality of solar cells electrically connected with each other. The solar cells are solar cells according to any one of the above embodiments.

In some embodiments, a method for preparing the solar cell according to the above embodiments includes step S10 to step S60.

According to different demands, the sequence of some steps or sub-steps of the method for preparing the solar cell can be changed, and some steps or sub-steps can be omitted or merged.

Step S10: A silicon substrate is provided, where the silicon substrate includes a first surface and an opposite second surface, and a plurality of side surfaces connecting the first surface and the second surface, and pyramid-base texture structures are formed on the first surface, the second surface, and the side surface.

Specifically, the silicon substrate is an N-type conductive substrate or a P-type conductive substrate. The silicon substrate is subjected to alkali polishing treatment in a trough type machine, and the pyramid-base texture morphology is formed on the surface of the silicon substrate. The pyramid-base texture appearance includes a coexistence structure of a polished surface and the pyramid-base texture structures, or the pyramid-base texture morphology is pyramid-base texture structures subjected to polishing treatment.

Exemplarily, a pyramid base transverse dimension of the pyramid-base texture structures formed in step S10 ranges from 10 μm to 30 μm (for example, 10 μm to 12 μm, 12 μm to 13 μm, 13 μm to 14.5 μm, 14.5 μm to 15 μm, 15 μm to 20 μm, 20 μm to 25 μm, 25 μm to 28 μm, 28 μm to 30 μm, and the like).

Exemplarily, a longitudinal height of the pyramid-base texture structures formed in step S10 ranges from 0.01 μm to 8 μm (for example, 0.01 μm to 0.05 μm, 0.05 μm to 0.1 μm, 0.1 μm to 0.4 μm, 0.4 μm to 0.5 μm, 0.5 μm to 0.7 μm, 0.7 μm to 1 μm, 1 μm to 1.3 μm, 1.3 μm to 1.5 μm, 1.5 μm to 1.8 μm, 1.8 μm to 2.3 μm, 2.3 μm to 2.8 μm, 2.8 μm to 3.3 μm, 3.3 μm to 4 μm, 4 μm to 5 μm, 5 μm to 6 μm, 6 μm to 7 μm, 7 μm to 8 μm, and the like).

Exemplarily, the pyramid base of the pyramid-base texture structures formed in step S10 is in a rectangle shape, the dimension of the rectangle is 15 μm×14.5 μm, and the pyramid base longitudinal dimension of the pyramid-base texture structures is 0.5 μm.

Step S20: Dielectric layers and doped conductive layers are sequentially formed in at least partial regions of the second surface, the side surfaces, and the first surface of the silicon substrate, and the doped conductive layers are positioned at one side of the corresponding dielectric layers away from the silicon substrate. The doped conductive layers can be doped polysilicon layers.

Specifically, the passivation layer (such as silicon oxide or aluminum oxide) is prepared through low pressure chemical vapor deposition (LPCVD) or plasma enhanced chemical vapor deposition (PECVD), and doping atom diffusion is performed to form a boron-doped polysilicon structure and/ or a phosphor-doped polysilicon structure. The dielectric layers and the doped polysilicon layers cover partial regions of the second surface, the plurality of side surfaces, and the first surface.

The dielectric layers formed in step S20 are the first dielectric layer and the second dielectric layer described above.

The operation of doping atom diffusion in step S20 is performed for at least once. In some embodiments, the operation of doping atom diffusion can be performed twice or more times.

Step S30: The dielectric layer and the doped polysilicon layer positioned on the first surface are removed, and at least partial dielectric layers and doped polysilicon layers positioned on the first regions of the side surfaces close to the first surface are removed.

Step S30: All of the dielectric layers and the doped polysilicon layers in the first surface, and all or a portion of the dielectric layers and the doped polysilicon layers on the side surfaces are etched away by using a chain type etching device.

Specifically, the silicon substrate provided with the dielectric layers and the doped polysilicon layers is placed in the chain type etching device, so that one side of the first surface of the silicon substrate is downward to be in contact with an etching solution used in the chain type etching device, and the etching solution at least covers a portion of the dielectric layers and the doped polysilicon layers positioned at the side surfaces.

In some embodiments, in the extending direction from the first surface to the second surface, the distribution proportion of the first region in the side surface ranges from 20% to 100%.

Exemplarily, 85% of the side surface is in sufficient contact with the etching solution (the side close to the first surface), and 15% of the side surface is not in contact with the etching solution (the side close to the second surface).

Step S40: A first region and/or a second region are/is formed on the side surface.

Alkali texturing treatment is performed to form pyramid structures. The dimension of the pyramid structures can be controlled by controlling the types of additives and the reaction duration, and the first pyramid structures and the second pyramid structures are formed; or the first pyramid structures and the second pyramid structures are respectively formed in a step-by-step texturing manner.

In the alkali texturing treatment process, the portion of the surface of the silicon substrate exposed from the side surface is etched by alkali liquor to form the textured pyramid structures. The portion of the surface of the silicon substrate not being exposed does not form a textured surface during texturing since the dielectric layers (such as silicon oxide) basically does not react with the alkali liquor under the process conditions at this portion of the surface of the silicon substrate, so the pyramid-base texture structures are presented.

Exemplarily, in the alkali texturing process, the first surface exposing the silicon substrate and 85% of the side surface close to the front surface can be etched by alkali to form a combined structure of the first texture regions and the second texture regions. 15% of the side surface close to the back surface is protected by the dielectric layers and the doped polysilicon layers, and does not form a pyramid structure, and the pyramid-base texture structures can be observed.

Step S50: The passivation layer and an anti-reflection layer are formed.

Specifically, the passivation layer can be deposited at one side where the first surface is located, one side where the second surface is located, and a plurality of side surfaces of the silicon substrate through atomic layer deposition (ALD) to provide a passivation effect. The anti-reflection layer can be respectively deposited at the side where the first surface is located, the side where the second surface is located, and the plurality of side surfaces of the silicon substrate through plasma enhanced chemical vapor deposition. The combined morphology of the textured pyramid structures at the front surface, the textured pyramid structures at the side surfaces, and the pyramid-base texture structures can be observed after the passivation layer and the anti-reflection layer are formed.

Step S60: Electrodes are formed.

Specifically, the electrodes can be formed in a silk-screen printing manner. The combined morphology of the textured pyramid structures at the front surface, the textured pyramid structures at the side surfaces, and the pyramid-base texture structures can be observed after electrode printing.

Based on the above, the side surfaces of the solar cell of the embodiments of the present application include a plurality of first pyramid structures, a plurality of second pyramid structures, and a plurality of prismatic structures, and the first pyramid structures of the first texture regions can enhance the light trapping effect of the side surface of the solar cell and improve the light utilization rate of the solar cell. In addition, the second pyramid structures in the second texture regions are designed and formed. The second pyramid structures having the larger structural dimension can provide a larger surface area than the first pyramid structures, a larger deposited film area is provided for subsequent deposited films, and the deposited film quality is improved. Therefore, a hybrid structure of a plurality of first pyramid structures and a plurality of second pyramid structures can achieve effects of passivation and light trapping of the side surfaces of the solar cell at the same time, and improve the photoelectric conversion efficiency of the solar cell.

In addition, compared with the textured structure in a pyramid shape, the prismatic structures formed in the second texture regions have the larger surface area, and provide a larger deposition area for the subsequent deposition of the passivation layer. Therefore, compared with the single textured structure in the related art, a hybrid structure of the first pyramid structures, the second pyramid structures, and the prismatic structures can achieve effects of passivation and light trapping of the side surfaces of the solar cell at the same time.

The above embodiments are merely illustrative of the technical solutions of the present application, but are not intended to limit the present application. Although the present application has been illustrated in detail with the reference to the exemplary embodiments, those of ordinary skill in the art should understand that modifications and equivalent substitutions can be made to the technical solutions of the present application without departing from the spirit and scope of the technical solutions of the present application.

What is claimed is:

1. A solar cell, comprising:
   a silicon substrate, wherein the silicon substrate comprises:
       a first surface and a second surface that are opposite to each other; and
       a plurality of side surfaces connecting the first surface and the second surface, wherein at least one side surface of the plurality of side surfaces comprises first texture regions and second texture regions, wherein the first texture regions comprise a plurality of first pyramid structures, and the second texture regions comprise a plurality of second pyramid structures,
       wherein a structural dimension of a second pyramid structure of the plurality of second pyramid structures is greater than a structural dimension of a first pyramid structure of the plurality of first pyramid structures, and wherein the second texture regions are located between adjacent first texture regions of the first texture regions; and
   a passivation layer, wherein the passivation layer covers the first texture regions and the second texture regions of the at least one side surface.

2. The solar cell according to claim 1, wherein the second texture regions extend among the first texture regions in one or more manners of a straight line, a broken line or a curve line.

3. The solar cell according to claim 2, wherein extending directions of the second texture regions are not parallel to a thickness direction of the solar cell, and wherein at least two of the second texture regions have extending directions that are parallel to each other.

4. The solar cell according to claim 1, wherein the second texture regions comprise prismatic structures, and a length of a prismatic structure of the prismatic structures ranges from 200 nm to 6 μm.

5. Thes solar cell according to claim 1, wherein the structural dimension of the first pyramid structure ranges from 0.05 μm to 2 μm.

6. The solar cell according to claim 1, wherein the structural dimension of the second pyramid structure ranges from 2 μm to 6 μm.

7. The solar cell according to claim 1, wherein the at least one side surface comprises:
   a first region connected with the first surface, wherein the first texture regions and the second texture regions are arranged in the first region, and a width of the first region is 20% to 100% of a width of the side surface.

8. The solar cell according to claim 1, wherein the at least one side surface comprises:
   a first region; and
   a second region connected to a side of the second surface, wherein the first texture regions and the second texture regions are arranged in the first region, and the second region comprises a plurality of pyramid-base texture structures.

9. The solar cell according to claim 8, wherein a boundary line between the first region and the second region is a curve line, and wherein concave pits are arranged in the second region and close to the boundary line.

10. The solar cell according to claim 9, wherein in a thickness direction of the silicon substrate, a width of a region comprising the concave pits is no more than 60% of a width of the second region.

11. The solar cell according to claim 9, wherein shapes of the concave pits comprises one or more of an inverted pyramid shape, an inverted hemispherical shape, and a terrace shape, and
   wherein a cross section area of a concave pit increases in a direction perpendicular to and away from the side surface.

12. The solar cell according to claim 9, wherein a diameter of a cross section of a concave pit of the concave pits on the side surface ranges from 0.1 μm to 5 μm, and a depth of the concave pit ranges from 0.05 μm to 2 μm.

13. The solar cell according to claim 1, wherein the passivation layer comprises an aluminum oxide layer and a silicon nitride layer sequentially arranged in a direction away from the silicon substrate.

14. A photovoltaic module, comprising:
   a plurality of solar cells electrically connected to each other, wherein each of the plurality of solar cells comprises:

a silicon substrate, wherein the silicon substrate comprises:

a first surface and a second surface that are opposite to each other; and a plurality of side surfaces connecting the first surface and the second surface, wherein at least one side surface of the plurality of side surfaces comprises first texture regions and second texture regions, each of the first texture regions comprises a plurality of first pyramid structures, and the second texture regions comprise a plurality of second pyramid structures, wherein a structural dimension of a second pyramid structure of the plurality of second pyramid structures is greater than a structural dimension of a first pyramid structure of the plurality of first pyramid structures, and wherein the second texture regions are located between adjacent first texture regions of the first texture regions; and a passivation layer, wherein the passivation layer covers the first texture regions and the second texture regions of the at least one side surface.

\* \* \* \* \*